(12) United States Patent
Miyoshi

(10) Patent No.: US 11,165,402 B2
(45) Date of Patent: Nov. 2, 2021

(54) LC COMPOSITE COMPONENT INCLUDING A COIL AND CONFIGURED TO REDUCE THE Q-VALUE OF THE COIL

(71) Applicant: Murata Manufacturing Co., Ltd., Kyoto (JP)

(72) Inventor: Hiromi Miyoshi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 542 days.

(21) Appl. No.: 15/983,015

(22) Filed: May 17, 2018

(65) Prior Publication Data

US 2018/0351526 A1    Dec. 6, 2018

(30) Foreign Application Priority Data

Jun. 6, 2017 (JP) .............................. JP2017-111944

(51) Int. Cl.

| | | |
|---|---|---|
| *H03H 1/00* | (2006.01) | |
| *H01G 4/30* | (2006.01) | |
| *H01F 27/29* | (2006.01) | |
| *H01G 4/40* | (2006.01) | |
| *H01F 27/40* | (2006.01) | |

(Continued)

(52) U.S. Cl.
CPC ........... *H03H 1/00* (2013.01); *H01F 17/0013* (2013.01); *H01F 27/06* (2013.01); *H01F 27/29* (2013.01); *H01F 27/292* (2013.01); *H01F 27/40* (2013.01); *H01G 2/02* (2013.01); *H01G 4/30* (2013.01); *H01G 4/40* (2013.01); *H03H 7/0115* (2013.01); *H01F 2017/0026* (2013.01); *H01G 4/232* (2013.01); *H03H 2001/0078* (2013.01); *H03H 2001/0085* (2013.01)

(58) Field of Classification Search
CPC .................. H03H 1/00; H03H 7/0115; H02M 2001/0078; H01F 17/0006; H01F 27/06; H01F 27/2804; H01F 27/292; H01F 27/40; H01F 17/0013; H01G 2/02; H01G 4/232; H01G 4/30
See application file for complete search history.

(56) References Cited

U.S. PATENT DOCUMENTS

2014/0224418 A1   8/2014 Seko
2017/0229247 A1*  8/2017 Yoneda .................. H01G 4/232

FOREIGN PATENT DOCUMENTS

JP   2001-134732 A   5/2001
JP   2005-184127 A   7/2005

(Continued)

OTHER PUBLICATIONS

An Office Action; "Notification of Reasons for Refusal," Mailed by the Japanese Patent Office dated Oct. 1, 2019, which corresponds to Japanese Patent Application No. 2017-111944 and is related to U.S. Appl. No. 15/983,015; with English language translation.

*Primary Examiner* — Nguyen Tran
*Assistant Examiner* — Trinh Q Dang
(74) *Attorney, Agent, or Firm* — Studebaker & Brackett PC

(57) ABSTRACT

An LC composite component comprising an element body, a helically wound coil disposed in the element body, and a capacitor disposed on an outer circumferential side of the coil in the element body. When viewed in an axial direction of the coil, the element body is rectangular, and the capacitor is disposed between at least two sides of the element body and the coil.

18 Claims, 5 Drawing Sheets

(51) Int. Cl.
  *H01F 27/06*      (2006.01)
  *H03H 7/01*       (2006.01)
  *H01F 17/00*      (2006.01)
  *H01G 2/02*       (2006.01)
  *H01G 4/232*      (2006.01)

(56) References Cited

FOREIGN PATENT DOCUMENTS

| | | |
|---|---|---|
| JP | 2014154716 A | 8/2014 |
| JP | 2017011876 A | 1/2017 |

\* cited by examiner

LC COMPOSITE COMPONENT INCLUDING A COIL AND CONFIGURED TO REDUCE THE Q-VALUE OF THE COIL

CROSS REFERENCE TO RELATED APPLICATION

This application claims benefit of priority to Japanese Patent Application 2017-111944, filed Jun. 6, 2017, the entire content of which is incorporated herein by reference.

BACKGROUND

Technical Field

The present disclosure relates to an LC composite component.

Background Art

A conventional LC composite component is described in Japanese Laid-Open Patent Publication No. 2001-134732. This LC composite component has a rectangular parallelepiped sheet body, a helical coil conductor layer disposed in the sheet body, and a capacitor conductor layer disposed in the sheet body. The coil conductor layer and the capacitor conductor layer are disposed on the same layer. When viewed in an axial direction of the coil conductor layer, the capacitor conductor layer is disposed between one side of the sheet body and a coil.

SUMMARY

The inventor of the present application found that the following problem exists when the conventional coil component as described above is actually manufactured and used.

Since the capacitor conductor layer is disposed in a narrow region of the sheet body, the area of the capacitor conductor layer is small. Therefore, the acquirable capacitance of the capacitor conductor layer becomes small, so that a resonance point cannot be formed on the low frequency side.

In this regard, it is conceivable that the area of the capacitor conductor layer is increased by forming the coil conductor layer on a layer different from the capacitor conductor layer. However, as the area of the capacitor conductor layer becomes larger, an overlap with the coil conductor layer becomes greater and the magnetic flux generated in the coil conductor layer is blocked by the capacitor conductor layer, so that an acquisition efficiency of the L-value of the coil decreases. As a result, the Q-value of the coil is reduced, and an intended filter characteristic may not be acquired due to a decrease in resonance peak and a broadening of bandwidth.

Therefore, the present disclosure provides an LC composite component capable of forming a resonance point on the lower frequency side while suppressing a reduction in the Q-value of the coil.

An LC composite component of an aspect of this disclosure comprises an element body, a helically wound coil disposed in the element body, and a capacitor disposed on an outer circumferential side of the coil in the element body. When viewed in an axial direction of the coil, the element body is rectangular, and the capacitor is disposed between at least two sides of the element body and the coil.

According to the LC composite component of the present disclosure, since the acquirable capacitance of the capacitor can be increased without overlapping the capacitor with the coil, a resonance point can be set on the low frequency side while suppressing a reduction in the Q-value of a resonance circuit.

In an embodiment of the LC composite component, the element body has a rectangular parallelepiped shape, the coil includes a plurality of coil conductor layers wound in parallel with one surface of the element body, the capacitor includes a plurality of capacitor conductor layers parallel to the one surface and facing each other. Also, the capacitor does not overlap the coil when viewed in a perpendicular direction of the one surface. The coil conductor layers and the capacitor conductor layers have a first coil conductor layer and a first capacitor conductor layer overlapping when viewed in a direction orthogonal to the perpendicular direction. Also, the first capacitor conductor layer has a facing portion facing the first coil conductor layer, and when viewed in the perpendicular direction, the facing portion is disposed between at least two sides of the one surface and the first coil conductor layer. According to the embodiment, the LC composite component has a laminated structure and can be reduced in size and height.

In an embodiment of the LC composite component, the first coil conductor layer and the first capacitor conductor layer are disposed on the same layer. According to the embodiment, since LC patterns are formed on the same layer, variations in stray capacitance can be reduced, and characteristics with narrow deviation can be achieved.

In an embodiment of the LC composite component, the coil has an axis parallel to a mounting surface of the element body. According to the embodiment, since the axis of the coil is parallel to the mounting surface of the element body, when the mounting surface of the element body is mounted on a mounting board, the magnetic flux of the coil is not blocked by the mounting board, the reduction in the Q-value of the coil can be suppressed.

In an embodiment of the LC composite component, the LC composite component further comprises a first external electrode and a second external electrode respectively electrically connected to a first end and a second end of the coil, the element body has a mounting surface on which both the first external electrode and the second external electrode are exposed, and the mounting surface is perpendicular to the one surface. According to the embodiment, since the axis of the coil is parallel to the mounting surface of the element body, when the mounting surface of the element body is mounted on a mounting board, the magnetic flux of the coil is not blocked by the mounting board, the reduction in the Q-value of the coil can be suppressed.

In an embodiment of the LC composite component, when viewed in the axial direction of the coil, at least a half region of the facing portion of the capacitor facing the coil is parallel to the facing portion of the coil facing the capacitor. According to the embodiment, since the capacitor has a shape along the outer circumference of the coil, the area of the capacitor becomes larger and stray capacitance increases in the facing portion of the capacitor and the facing portion of the coil. As a result, the capacitance of the capacitor is increased, and the resonance point can be formed on the low frequency side.

In an embodiment of the LC composite component, the facing portion of the capacitor and the facing portion of the coil are curves. According to the embodiment, since the facing portion of the capacitor and the facing portion of the coil are curves, the area of the capacitor becomes larger, and the areas of the facing portion of the capacitor and the facing portion of the coil become larger, so that the stray capacitance increases in the facing portion of the capacitor and the facing portion of the coil. As a result, the capacitance of the capacitor is increased, and the resonance point can be formed on the low frequency side.

In an embodiment of the LC composite component, the coil has a winding shape that is circular or elliptical when viewed in the axial direction of the coil. According to the embodiment, since the winding shape of the coil is circular or elliptical, a reflection loss of the coil can be reduced, and the reduction in the Q-value of the coil can be suppressed.

In an embodiment of the LC composite component, the capacitor is disposed between the mounting surface of the element body and the coil. According to the embodiment, the coil can be disposed separately from the mounting surface of the element body and, when the mounting surface of the element body is mounted on the mounting board, the interference between the magnetic flux of the coil and the mounting board can be reduced and the reduction in the Q-value of the coil can be suppressed.

In an embodiment of the LC composite component, the element body has a first end surface and a second end surface adjacent to the mounting surface and opposite to each other, and the first external electrode is exposed on the first end surface and the second external electrode is exposed on the second end surface. According to the embodiment, since the first external electrode is exposed from the first end surface and the second external electrode is exposed from the second end surface, the first and second end surfaces can also be fixed to the mounting board, so that a fixing force can be improved.

In an embodiment of the LC composite component, neither the first external electrode nor the second external electrode is exposed on a top surface of the element body opposite to the mounting surface. According to the embodiment, the first external electrode and the second external electrode can be formed as L-shaped electrodes, so that the reduction in the Q-value of the coil can be suppressed.

In an embodiment of the LC composite component, the first external electrode and the second external electrode include an external electrode conductor layer embedded in the element body, respectively. According to the embodiment, since the first external electrode and the second external electrode can be embedded in the element body, the size can be reduced, and the position of the external electrode conductor layer can accurately be formed, so that a narrow deviation can be achieved in terms of characteristic variations.

According to the LC composite component of one embodiment of the present disclosure, the resonance point can be formed on the lower frequency side while suppressing a reduction in the Q-value of the coil.

DETAILED DESCRIPTION

An aspect of the present disclosure will now be described in detail with reference to shown embodiments.

First Embodiment

Figure 1:
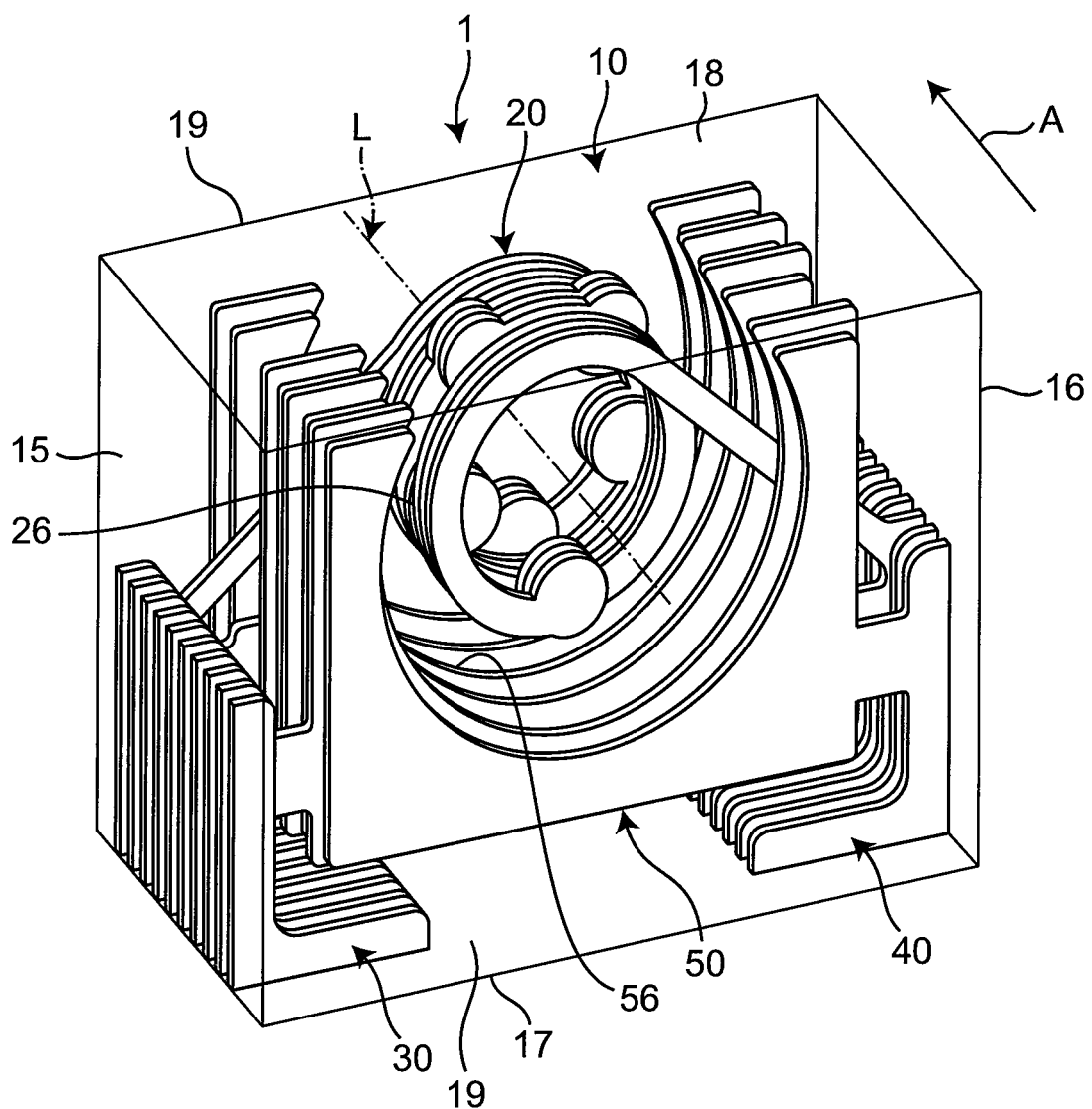
FIG. 1 is a transparent perspective view of a first embodiment of an LC composite component.
Figure 2:
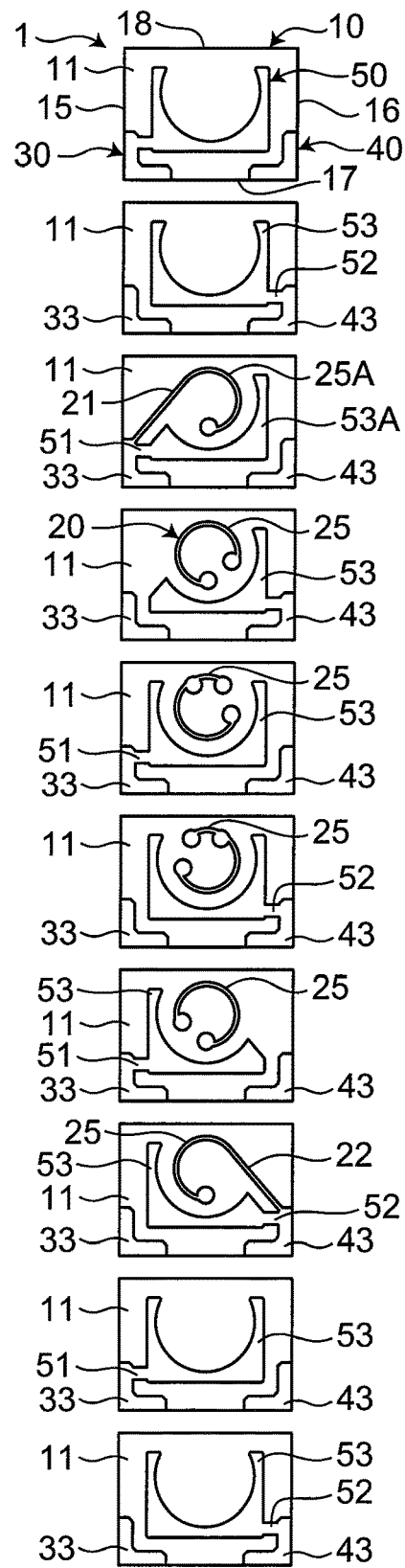
FIG. 2 is an exploded plane view of the LC composite component.

FIG. 1 is a transparent perspective view of a first embodiment of an LC composite component. FIG. 2 is an exploded plane view of the LC composite component. As shown in FIGS. 1 and 2, an LC composite component 1 includes an element body 10, a coil 20 disposed in the element body 10, a capacitor 50 disposed in the element body 10, and a first external electrode 30 and a second external electrode 40 disposed in the element body 10. Although depicted as being transparent in FIG. 1 so that a structure can easily be understood, the element body 10 may be semitransparent or opaque or may be colored.

A first end of the coil 20 is connected to the first external electrode 30, and a second end of the coil 20 is connected to the second external electrode 40. The capacitor 50 is electrically connected in parallel to the coil 20. The LC composite component 1 constitutes an LC parallel resonator. The coil 20 and the capacitor 50 are electrically connected through the first and second external electrodes 30, 40 to a mounting board not shown.

The element body 10 is formed by laminating multiple insulating layers 11. The insulating layers 11 are made of, for example, a material mainly composed of borosilicate glass or a material such as ferrite and resin. In the element body 10, an interface between the multiple insulating layers 11 may not be clear due to firing etc. The element body 10 is formed into a substantially rectangular parallelepiped shape. The surface of the element body 10 has a first end surface 15, a second end surface 16 opposite to the first end surface 15, a bottom surface 17 connected between the first end surface 15 and the second end surface 16, a top surface 18 opposite to the bottom surface 17, and two side surfaces 19, 19 opposite to each other (front and rear surfaces of FIG. 1). The bottom surface 17 has both the first external electrode 30 and the second external electrode 40 exposed thereon and thereby acts as a mounting surface for mounting the LC composite component 1 on the mounting board. The first end surface 15, the second end surface 16, the bottom surface 17, and the top surface 18 are surfaces parallel to a lamination direction A of the insulating layers 11. The two side surfaces 19, 19 are parallel to the lamination direction A. It is noted that "orthogonal" in this application is not limited to a strictly orthogonal relationship and includes a substantially orthogonal relationship in consideration of a realistic variation range. FIG. 2 shows layers along the lamination direction A of FIG. 1 from a lower layer to an upper layer.

The coil 20 is made of a conductive material such as Ag, Cu, Au, and an alloy mainly composed thereof, for example. The coil 20 is helically wound along the lamination direction A of the insulating layers 11. An axis L of the coil 20 is parallel to the bottom surface (mounting surface) 17 of the element body 10. The axis L of the coil 20 means the central axis of the helical shape of the coil 20.

The coil 20 includes multiple coil conductor layers 25 wound in a planar shape on the insulating layers 11. Since the coil 20 is made up of the coil conductor layers 25 that can be microfabricated in this way, the LC composite component 1 can be reduced in size and height. The coil conductor layers 25 adjacent in the lamination direction A are electrically connected in series through via conductor layers 26 penetrating the insulating layers 11 in the thickness direction. The multiple coil conductor layers 25 are electrically connected to each other in series in this way to constitute a helix. Specifically, the coil 20 has a laminated configuration of the multiple coil conductor layers 25 electrically connected to each other in series and having the number of turns less than one, and the coil 20 has a helical shape. In this case, a parasitic capacitance generated in the coil conductor layers 25 and a parasitic capacitance generated between the coil conductor layers 25 can be reduced, and the Q-value of the inductor component 1 can be improved.

The coil 20 has a first lead-out conductor layer 21 connected to the first external electrode 30 and a second lead-out conductor layer 22 connected to the second external electrode 40. The first lead-out conductor layer 21 is connected to one of the endmost coil conductor layers 25 in the lamination direction A, and the second lead-out conductor layer 22 is connected to the other of the endmost coil conductor layers 25 in the lamination direction A. In this embodiment, the coil conductor layers 25, the first and second lead-out conductor layers 21, 22, and the first and second external electrodes 30, 40 are integrated without a clear boundary; however, this is not a limitation and the layers and electrodes may respectively be made of different materials or formed by different construction methods so that boundaries may exist. Specifically, the first lead-out conductor layer 21 and the second lead-out conductor layer 22 can be differentiated from the coil conductor layers 25 as portions departing from a coil winding shape in which the multiple coil conductor layers 25 of the coil 20 overlap each other when viewed in the lamination direction A.

The winding shape of the coil 20 is circular when viewed in the direction of the axis L of the coil 20. The winding shape of the coil 20 is a shape formed by the multiple coil conductor layers 25 overlapping each other. The winding shape of the coil 20 is not limited to this shape and may be an elliptical shape, a rectangular shape, or other polygonal shapes, for example.

The capacitor 50 is located on the outer circumferential side of the coil winding shape in which the coil conductor layers 25 overlap each other. The element body 10 is rectangular when viewed in the direction of the axis L of the coil 20, and the capacitor 50 is disposed between the coil 20 and three sides (the first end surface 15, the second end surface 16, and the bottom surface 17) of the side surface 19 of the element 10 when viewed in the direction of the axis L of the coil 20. The capacitor 50 is disposed to surround the coil 20 on the three sides of the element body 10. Specifically, the capacitor 50 has a first side portion facing the first end surface 15 of the element body 10, a second side portion facing the second end surface 16 of the element body 10, and a third side portion facing the bottom surface 17 of the element body 10.

The capacitor 50 is made of a conductive material such as Ag, Cu, Au, and an alloy mainly composed thereof, for example. The capacitor 50 includes multiple capacitor conductor layers 53 disposed on the insulating layers 11. The multiple capacitor conductor layers 53 are alternately connected to the first external electrode 30 and the second external electrode 40 along the lamination direction A. Therefore, one of the capacitor conductor layers 53 adjacent in the lamination direction A is connected through the first lead-out conductor layer 51 to the first external electrode 30, and the other of the capacitor conductor layers 53 adjacent in the lamination direction A is connected through the second lead-out conductor layer 52 to the second external electrode 40.

The capacitor 50 includes a facing portion 56 facing the coil 20, and the coil 20 includes a facing portion 26 facing the capacitor 50. When viewed in the direction of the axis L of the coil 20, the facing portion 56 is parallel to the facing portion 26. The facing portion 56 and the facing portion 26 are curves. At least a half region of the facing portion 56 may be parallel to the facing portion 26.

The first external electrode 30 and the second external electrode 40 are made of a conductive material such as Ag, Cu, Au, and an alloy mainly composed thereof, for example. The first external electrode 30 is formed over the first end surface 15 and the bottom surface 17. The second external electrode 40 is formed over the second end surface 16 and the bottom surface 17. The first external electrode 30 and the second external electrode 40 are embedded in the element body 10 such that the surfaces thereof are exposed. Since the first external electrode 30 is exposed from the first end surface 15 and the second external electrode 40 is exposed from the second end surface 16, the first and second end surfaces 15, 16 can also be fixed to the mounting board, so that a fixing force can be improved. The first external electrode 30 and the second external electrode 40 can be formed as L-shaped electrodes, so that the reduction in the Q-value of the coil 20 can be suppressed.

The first external electrode 30 and the second external electrode 40 have a configuration in which pluralities of first external electrode conductor layers 33 and second external electrode conductor layers 43 embedded in the element body 10 (the insulating layers 11) are laminated. As a result, since the external electrodes 30, 40 can be embedded in the element body 10, the LC composite component 1 can be reduced in size as compared to a configuration in which the external electrodes are externally attached to the element body 10. Additionally, the coil 20 and the external electrodes 30, 40 can be formed at the same steps, so that variations in the positional relationship between the coil 20 and the external electrodes 30, 40 can be reduced to decrease variations in electrical characteristics of the LC composite component 1.

In the LC composite component 1, the coil conductor layers 25 and the capacitor conductor layers 53 have a first coil conductor layer 25A and a first capacitor conductor layer 53A disposed on the same layer, and the first capacitor conductor layer 53A has the facing portion 56 facing the first coil conductor layer 25A, and when viewed from the lamination direction A, the facing portion 56 is disposed between the three sides of the side surface 19 and the first coil conductor layer 25A.

Specifically, the facing portion 56 forms a stray capacitance with the first coil conductor layer 25A, and since the first capacitor conductor layer 53A has the facing portion 56 on three sides of the first coil conductor layer 25A, the LC composite component 1 can increase the stray capacitance formed per area of the first capacitor conductor layer 53A. Therefore, an effective capacitance per volume of the capacitor 50 can be increased, and a resonance point can be formed on the low frequency side. Since the first coil conductor layer 25A and the first capacitor conductor layer 53A are formed on the same layer, variations in stray capacitance can be reduced, and characteristics with narrow deviation can be achieved.

When viewed in the lamination direction A, the capacitor 50 does not overlap the coil 20. As a result, since the LC composite component 1 has the increased effective capacitance per volume of the capacitor 50, the capacitance of the capacitor 50 can be increased without overlapping the capacitor conductor layers 53 with the coil conductor layers 25. In other words, the resonance point can be set on the lower frequency side while suppressing the reduction in the Q-value of the coil 20.

Since the axis L of the coil 20 is parallel to the bottom surface (mounting surface) 17 of the element body 10, when the bottom surface 17 of the element body 10 is mounted on the mounting board, the magnetic flux of the coil 20 is not blocked by the mounting board. As a result, a reduction in the acquisition efficiency of the L-value of the coil 20 can be suppressed and the reduction in the Q-value of the coil 20 can be suppressed.

Since the facing portion 56 is parallel to the facing portion 26, the capacitor 50 has a shape along the outer circumference of the coil 20. This makes the area of the capacitor 50 larger, and the stray capacitance increases in the facing portion 56 and the facing portion 26. Therefore, the capacitance of the capacitor 50 is increased, and the resonance point can be formed on the low frequency side.

Since the facing portion 56 and the facing portion 26 are curves, the area of the capacitor 50 becomes larger, and the areas of the facing portion 56 and the facing portion 26 become larger, so that the stray capacitance increases in the facing portion 56 and the facing portion 26. Therefore, the capacitance of the capacitor 50 is increased, and the resonance point can be formed on the low frequency side.

Since the winding shape of the coil 20 is circular or elliptical, a reflection loss of the coil 20 can be reduced, and the reduction in the Q-value of the coil 20 can be suppressed.

Since the capacitor 50 is disposed between the bottom surface 17 of the element body 10 and the coil 20, the coil 20 can be disposed separately from the bottom surface 17 of the element body 10. Therefore, when the bottom surface 17 of the element body 10 is mounted on the mounting board, the interference between the magnetic flux of the coil 20 and the mounting board can be reduced and the reduction in the Q-value of the coil can be suppressed.

Second Embodiment

Figure 3:
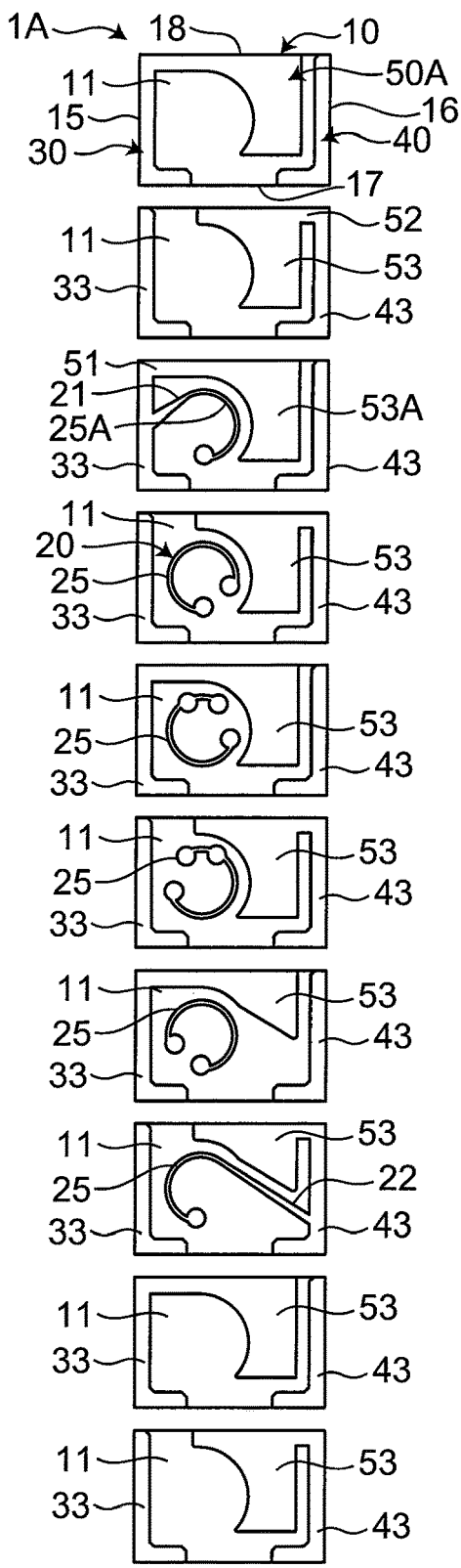
FIG. 3 is an exploded plane view of a second embodiment of the LC composite component.

FIG. 3 is an exploded plane view of a second embodiment of the LC composite component. The second embodiment is different from the first embodiment in the positions of the capacitor. This different configuration will hereinafter be described. In the second embodiment, the same constituent elements as the first embodiment are denoted by the same reference numerals as the first embodiment and therefore will not be described.

As shown in FIG. 3, an LC composite component 1A of the second embodiment has a capacitor 50A disposed between the coil 20 and two sides (the second end surface 16 and the top surface 18) of the element body 10. The first external electrode 30 extends from the bottom surface 17 to the top surface 18 of the first end surface 15 of the element body 10 and the second external electrode 40 extends from the bottom surface 17 to the top surface 18 of the second end surface 16 of the element body 10. Therefore, the coil 20 is located on the first external electrode 30 side, and the capacitor 50A is located on the second external electrode 40 side.

As in the first embodiment, the capacitor 50A includes the multiple capacitor conductor layers 53. The multiple capacitor conductor layers 53 are alternately connected to the first external electrode 30 and the second external electrode 40 along the lamination direction A. As in the first embodiment, the coil 20 includes the multiple coil conductor layers 25. The coil conductor layer 25 at one end in the lamination direction A is connected to the first external electrode 30 and the coil conductor layer 25 at the other end in the lamination direction A is connected to the second external electrode 40.

According to the LC composite component 1A, since the capacitor 50A is disposed between the two sides of the element body 10 and the coil 20, the resonance point can be formed on the low frequency side and an attenuation amount can be increased as in the first embodiment.

The present disclosure is not limited to the embodiments described above and may be changed in design without departing from the spirit of the present disclosure. For example, respective feature points of the first and second embodiments may variously be combined.

Although the capacitor is disposed between two or three sides of the element body and the coil when viewed from the axial direction of the coil in the embodiments, the capacitor may be disposed between the four sides of the element body and the coil when viewed in the axial direction of the coil. Therefore, the capacitor may be disposed between at least two sides of the element body and the coil. In other words, the facing portion of the first capacitor conductor layer wound in parallel with one surface of the element body is disposed between at least two sides of one surface of the element body and the first coil conductor layer when viewed in a perpendicular direction of one surface of the element body.

Although the portions of the first and second external electrodes exposed from the element body are left as they are in the embodiments, the portions of the first and second external electrodes exposed from the element body may be plated with Ni, Cu, Sn, etc.

Although disposed on the bottom surface and the end surface of the element body in the embodiments, the first and second external electrodes may be disposed only on the bottom surface of the element body or may be exposed on the bottom surface, the top surface, and the end surfaces. When the first and second external electrodes are exposed on the end surfaces of the element body, solder forms fillets at the time of mounting on the mounting board so that the fixing force between the LC composite component and the mounting board can be improved. If none of the first and second external electrodes are exposed on the top surface of the element body, the interference between the magnetic flux of the coil and the first and second external electrodes can be reduced while ensuring the fixing force, and the reduction in the Q-value of the coil can be suppressed as well.

Although constituting an LC parallel resonator in the embodiments, the LC composite component may constitute an LC series resonator or may constitute other LC circuits.

The LC composite component of the present disclosure is applicable to, for example, a small component of 0.4 mm, 0.2 mm, and 0.3 mm in the length direction (e.g., the direction from the first end surface toward the second end surface and perpendicular to the lamination direction A), the width direction (e.g., the lamination direction A), and the height direction (e.g., the direction from the bottom surface toward the top surface and perpendicular to the lamination direction A), respectively, of the component. The dimensions in the length direction, the width direction, and the height direction may be 0.6 mm, 0.3 mm, and 0.4 mm, respectively, or may be 1.0 mm, 0.5 mm, and 0.7 mm, respectively. The dimensions in the width direction and the height direction may be equal.

Experimental Example

Results of simulation with the first embodiment (FIG. 1), a first comparative example, and a second comparative example will be described.

Figure 4A:
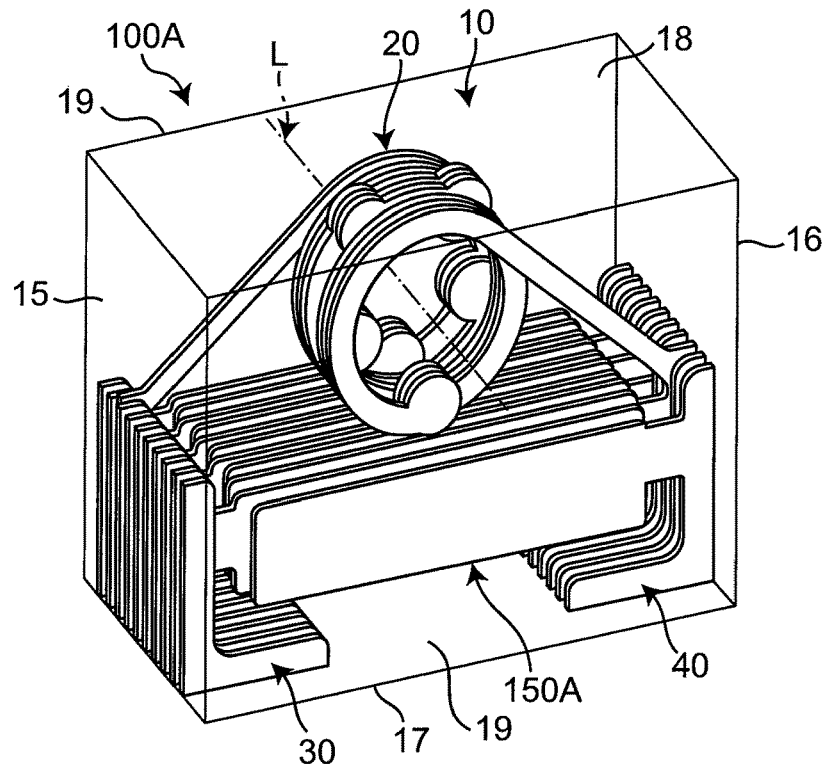
FIG. 4A is a transparent perspective view of a first comparative example of the LC composite component.

As shown in FIG. 4A, an LC composite component 100A of the first comparative example is an LC composite component as described in Japanese Laid-Open Patent Publication No. 2001-134732. A capacitor 150A is disposed between the bottom surface 17 of the element body 10 and the coil 20 when viewed in the direction of the axis L of the coil 20.

Figure 4B:
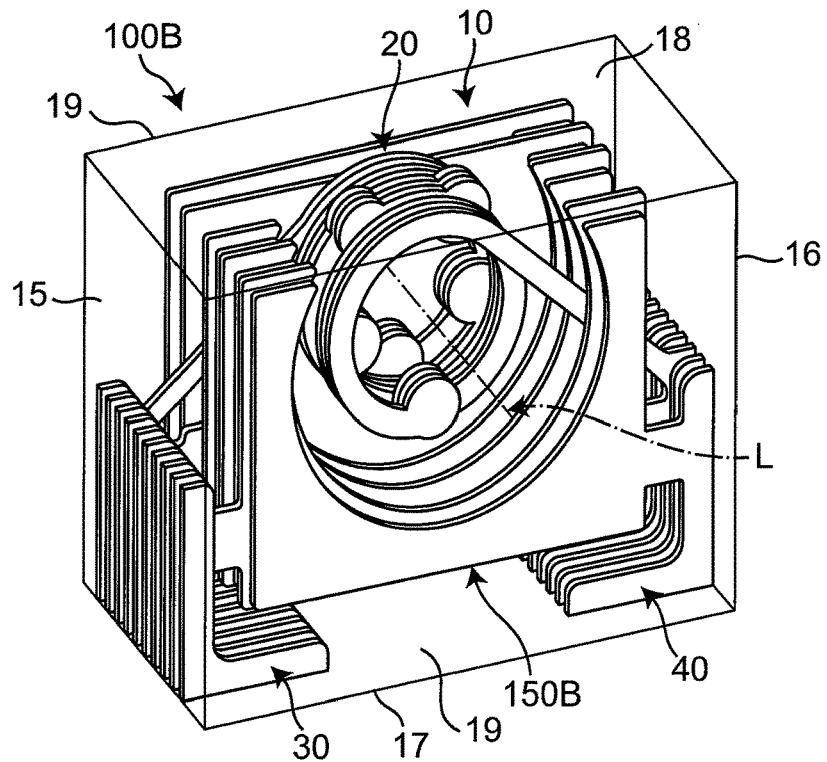
FIG. 4B is a transparent perspective view of a second comparative example of the LC composite component.

As shown in FIG. 4B, an LC composite component 100B of the second comparative example is an LC composite component as described in Japanese Laid-Open Patent Publication No. 2005-184127. A capacitor 150B is disposed at a position overlapping an inner diameter portion (the axis L of the coil 20) of the coil 20.

In FIGS. 4A and 4B, the same constituent elements as the first embodiment are denoted by the same reference numerals as the first embodiment (FIG. 1) and therefore will not be described.

Figure 5:
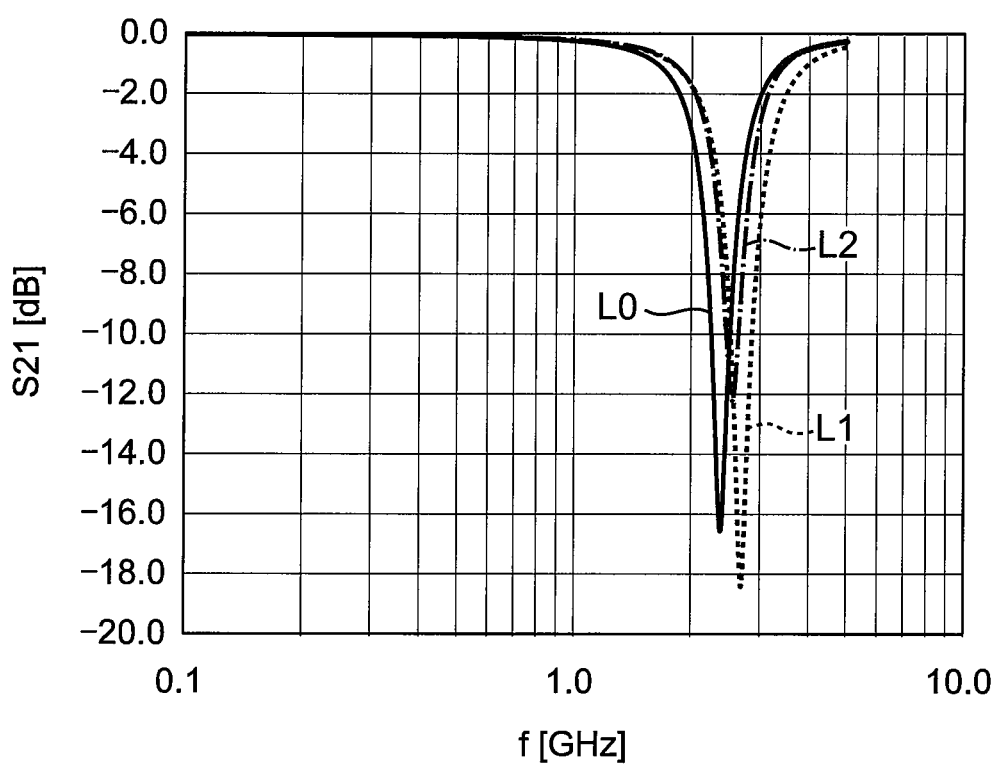
FIG. 5 is a graph of a relationship between a resonance frequency and S21.

The results of simulation with the first embodiment, the first comparative example, and the second comparative example are shown in Table 1 and FIG. 5.

In Table 1, "electrode thickness" indicates a thickness of an external electrode in an axial direction of a coil, "element body thickness" indicates a thickness of an element body in an axial direction of a coil, "f" indicates a resonance frequency, "L" indicates an inductance value at 500 MHz, "C" indicates a capacitor capacitance, and "S21" indicates an attenuation characteristic.

In FIG. 5, the first embodiment is represented by a solid line L0, the first comparative example is represented by a dotted line L1, and the second comparative example is represented by a dashed-dotted line L2.

TABLE 1

|  | first embodiment | first comparative example | second comparative example |
| --- | --- | --- | --- |
| electrode thickness [μm] | 7.00 | 7.00 | 7.00 |
| element body thickness [μm] | 7.70 | 7.70 | 7.70 |
| f [GHz] | 2.39 | 2.67 | 2.56 |
| L (@500 MHz) [nH] | 2.20 | 2.18 | 1.67 |
| C [pF] | 2.03 | 1.63 | 2.33 |
| $S_{21}$ [dB] | −16.57 | −18.43 | −12.22 |

As shown in Table 1 and FIG. 5, the resonance frequency can be made smaller in the first embodiment as compared to the first comparative example. The resonance frequency f is represented by $f=1/(2\pi\sqrt{(LC)})$ and is determined by the capacitor capacitance and the inductance value. In the first embodiment, since the area of the capacitor can be made larger and the stray capacitance between the coil and the capacitor can be increased as compared to the first comparative example, a larger capacitor capacitance can be acquired. As a result, the wide range of the resonance frequency can be designed.

It is also found that the resonance frequency is smaller in the first embodiment than the second comparative example. In the second comparative example, since the capacitor area can be made larger, the capacitance of the capacitor can be increased; however, since the capacitor blocks the magnetic flux of the coil, the acquisition efficiency of the L-value is reduced, and therefore, the resonance frequency becomes larger in the second comparative example than the first embodiment. The attenuation amount is determined by the Q-values of the coil and the capacitor, and in the second comparative example, since the acquisition efficiency of the L-value is reduced, the Q-value of the coil is lowered, so that the attenuation amount becomes smaller (S21 becomes larger).

From these results, in the first embodiment, the design range of the resonance frequency can be widened, and the attenuation amount can be increased, as compared to the first and second comparative examples. Specifically, in the first comparative example, although the attenuation can be increased, the capacitance cannot be acquired, so that the setting range of the resonance frequency becomes narrow (on the low frequency side). In the second comparative example, since the larger capacitance can be acquired as compared to the first comparative example, the resonance frequency can be set on the lower frequency side; however, the attenuation amount is reduced since the Q-value of the coil decreases.

In the first embodiment, the resonance frequency can be set on the lower frequency side while suppressing a reduction in the attenuation amount. Additionally, in the first embodiment, although the capacitance is slightly smaller as compared to the second comparative example, the L value can be increased more, so that the resonance frequency can be set on the lowest frequency side. Furthermore, a high resonance frequency can be set by reducing the area of C. Therefore, the resonance frequency can most widely be set in the first embodiment.

(Example of Manufacturing Method)

An example of a manufacturing method of the first embodiment will be described.

First, a lowermost insulating layer is formed (a first step). Specifically, an insulating paste of glass etc. is printed on a base material such as a carrier film having a size of eight-inch square, and the insulating paste is entirely exposed to ultraviolet light to form the lowermost insulating layer. The lowermost insulating layer desirably has a color different from that of an exterior and the other insulating layers for detection of overturning etc. of a chip at the time of mounting. For the material of the insulating layer, a glass paste (relative permittivity after firing: 6) is used.

Subsequently, a wiring pattern is formed on the lowermost insulating layer (second step). Specifically, a photosensitive electrode paste is applied by printing on the lowermost insulating layer, and a wiring pattern (internal electrode) is formed by a photolithography method. At this step, external electrodes are formed at the same time. The numbers of layers, the pattern thickness, and the numbers of turns of a coil pattern and a capacitor pattern formed as internal electrodes are set to desired values depending on the L-value and the C-value desired to be acquired. The coil pattern is formed into a circular shape. The capacitor pattern is arranged to avoid an inner diameter portion of the coil and is formed on three sides of the coil pattern on the same layer as the coil pattern. A facing portion of the capacitor and a facing portion of the coil are formed into curves.

Subsequently, an insulating layer on the capacitor pattern or an insulating layer on the coil pattern and the capacitor pattern is formed (third step). On the coil pattern, the insulating layer having a via hole is formed by a photolithography method etc. At this step, a groove pattern is formed in the insulating layer in a shape along the external electrode shape on the external electrode. Subsequently, by forming a wiring pattern again on the insulating layer, the groove is filled with the electrode paste and the external electrode is connected. It is noted that only the capacitor pattern may be present on a processed layer due to setting of the numbers of layers of the coil pattern and the capacitor pattern, and in this case, only the groove pattern is formed in the shape along the external electrode shape without forming a via hole.

Subsequently, the capacitor patterns of the respective layers are alternately connected to the left and right external electrodes to achieve a structure forming a parallel capacitor.

Subsequently, in the coil pattern, lead-out conductor layers are disposed at least in the pattern of the first layer and the pattern of the last layer and connected to the external electrodes facing the respective lead-out conductor layers. The shapes of the capacitor pattern and the coil pattern are preferably formed into a 180° rotationally symmetrical shape so that the product has no directionality.

Subsequently, the second step and the third step are repeated to form a parallel resonance circuit having the coil pattern and the capacitor pattern integrated with the external electrodes.

Subsequently, for a final step, a laminate body fabricated through the steps is diced or cut by a guillotine etc. and divided into chips. The chips are fired to form chips of a desired size. At this step, since the chips shrink due to firing, the chips are divided in consideration of a shrinkage factor. Subsequently, the external electrodes thereof are plated with Ni, Cu, Sn, etc. to complete the manufacturing of chip coils.

What is claimed is:

1. An LC composite component comprising:
   an element body;
   a helically wound coil disposed in the element body; and
   a capacitor disposed on an outer circumferential side of the helically wound coil in the element body, wherein
   when viewed in an axial direction of the helically wound coil, the element body is rectangular, and the capacitor is disposed between at least two sides of the element body and the helically wound coil,
   the element body has a rectangular parallelepiped shape,
   the helically wound coil includes a plurality of coil conductor layers wound in parallel with one surface of the element body,
   the capacitor includes a plurality of capacitor conductor layers parallel to the one surface and facing each other,
   the capacitor does not overlap the helically wound coil when viewed in a perpendicular direction of the one surface,
   the coil conductor layers and the capacitor conductor layers have a first coil conductor layer and a first capacitor conductor layer overlapping when viewed in a direction orthogonal to the perpendicular direction,
   the first capacitor conductor layer has a facing portion facing the first coil conductor layer, and
   when viewed in the perpendicular direction, the facing portion is disposed between at least two sides of the one surface and the first coil conductor layer.

2. The LC composite component according to claim 1, wherein the first coil conductor layer and the first capacitor conductor layer are disposed on a same layer.

3. The LC composite component according to claim 1, wherein the axial direction of the helically wound coil is parallel to a mounting surface of the element body.

4. The LC composite component according to claim 1, further comprising:
   a first external electrode and a second external electrode respectively electrically connected to a first end and a second end of the helically wound coil,
   wherein
   the element body has a mounting surface on which both the first external electrode and the second external electrode are exposed, and
   the mounting surface is perpendicular to the one surface.

5. The LC composite component according to claim 1, wherein the capacitor is disposed between a mounting surface of the element body and the helically wound coil.

6. The LC composite component according to claim 1, wherein when viewed in the axial direction of the helically wound coil, at least a half region of a facing portion of the capacitor facing the helically wound coil is parallel to a facing portion of the helically wound coil facing the capacitor.

7. The LC composite component according to claim 1, wherein the helically wound coil has a winding shape that is circular or elliptical when viewed in the axial direction of the helically wound coil.

8. The LC composite component according to claim 2, further comprising:
   a first external electrode and a second external electrode respectively electrically connected to a first end and a second end of the helically wound coil,
   wherein
   the element body has a mounting surface on which both the first external electrode and the second external electrode are exposed, and
   the mounting surface is perpendicular to the one surface.

9. The LC composite component according to claim 2, wherein when viewed in the axial direction of the helically wound coil, at least a half region of a facing portion of the capacitor facing the helically wound coil is parallel to a facing portion of the helically wound coil facing the capacitor.

10. The LC composite component according to claim 2, wherein the helically wound coil has a winding shape that is circular or elliptical when viewed in the axial direction of the helically wound coil.

11. The LC composite component according to claim 3, wherein when viewed in the axial direction of the helically wound coil, at least a half region of a facing portion of the capacitor facing the helically wound coil is parallel to a facing portion of the helically wound coil facing the capacitor.

12. The LC composite component according to claim 3, wherein the helically wound coil has a winding shape that is circular or elliptical when viewed in the axial direction of the helically wound coil.

13. The LC composite component according to claim 4, wherein:
   the element body has a first end surface and a second end surface adjacent to the mounting surface and opposite to each other, and
   the first external electrode is exposed on the first end surface and the second external electrode is exposed on the second end surface.

14. The LC composite component according to claim 4, wherein each of the first external electrode and the second external electrode includes an external electrode conductor layer embedded in the element body.

15. The LC composite component according to claim 4, wherein when viewed in the axial direction of the helically wound coil, at least a half region of a facing portion of the capacitor facing the helically wound coil is parallel to a facing portion of the helically wound coil facing the capacitor.

16. The LC composite component according to claim 13, wherein neither the first external electrode nor the second external electrode is exposed on a top surface of the element body opposite to the mounting surface.

17. An LC composite component comprising:
an element body;
a helically wound coil disposed in the element body; and
a capacitor disposed on an outer circumferential side of the helically wound coil in the element body, wherein
when viewed in an axial direction of the helically wound coil, the element body is rectangular, and the capacitor is disposed between at least two sides of the element body and the helically wound coil,
when viewed in the axial direction of the helically wound coil, at least a half region of a facing portion of the capacitor facing the helically wound coil is parallel to a facing portion of the helically wound coil facing the capacitor.

18. The LC composite component according to claim 17, wherein the facing portion of the capacitor and the facing portion of the helically wound coil are curves.

* * * * *